(12) United States Patent
Kosaki et al.

(10) Patent No.: US 6,500,325 B2
(45) Date of Patent: *Dec. 31, 2002

(54) METHOD OF PLATING SEMICONDUCTOR WAFER AND PLATED SEMICONDUCTOR WAFER

(75) Inventors: Katsuya Kosaki, Tokyo (JP); Masahiro Tamaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/749,912

(22) Filed: Dec. 29, 2000

(65) Prior Publication Data

US 2001/0000891 A1 May 10, 2001

Related U.S. Application Data

(60) Continuation of application No. 09/468,330, filed on Dec. 21, 1999, now Pat. No. 6,210,554, which is a division of application No. 08/972,969, filed on Nov. 19, 1997, now Pat. No. 6,033,540.

(30) Foreign Application Priority Data

Apr. 28, 1997 (JP) ............................................. 9-110950

(51) Int. Cl.[7] ............................. C25D 5/00; C25D 5/02; C25D 7/00; C25D 11/32
(52) U.S. Cl. ............................ 205/96; 205/97; 205/123; 205/149; 205/157
(58) Field of Search ............................ 205/96, 97, 123, 205/149, 157; 428/450, 64.1

(56) References Cited

U.S. PATENT DOCUMENTS

| 4,530,742 A | 7/1985 | Carlin et al. ..................... 204/95 |
| 4,589,969 A | 5/1986 | Yurkov et al. ................... 204/290 |
| 4,797,182 A | 1/1989 | Beer et al. ..................... 104/14.1 |
| 5,391,285 A | 2/1995 | Lytle et al. ..................... 205/123 |
| 5,429,733 A | 7/1995 | Ishida ........................... 204/224 R |
| 5,443,707 A * | 8/1995 | Mori ............................... 204/242 |
| 5,447,615 A | 9/1995 | Ishida ........................... 204/224 R |
| 6,210,554 B1 * | 4/2001 | Kosaki et al. ..................... 205/96 |

FOREIGN PATENT DOCUMENTS

| DE | 2818829 | 4/1978 |
| JP | 6-158392 A * | 6/1994 |
| JP | 07197299 | 8/1995 |

OTHER PUBLICATIONS

Choi, Young–Sik et al.; "Three–Dimension Calculation of Current Distribution in Electrodeposition on Patterned Cathode with Auxiliary Electrode", *J. Electrochem. Soc.*, vol. 143, No. 2, (Feb. 1996).

* cited by examiner

Primary Examiner—Edna Wong
(74) Attorney, Agent, or Firm—Leydig, Voit & Mayer, Ltd.

(57) ABSTRACT

A method of plating which improves the uniformity of a plated coating thickness without changing the flow velocity of a feed plating solution. An aperture at a center of a mesh anode electrode of a plating apparatus produces an electric field density distribution between the mesh anode electrode and a wafer that is lower in the central portion of the wafer than at the edge portion of the wafer.

3 Claims, 7 Drawing Sheets

METHOD OF PLATING SEMICONDUCTOR WAFER AND PLATED SEMICONDUCTOR WAFER

"This is a continuation of application Ser. No. 09/468,330, filed on Dec. 21, 1999, now U.S. Pat. No. 6,210,554 which is a division of application Ser. No. 08/972,969, filed on Nov. 19, 1997, now U.S. Pat. No. 6,033,540, and which are incorporated by reference."

BACKGROUND OF THE INVENTION

1. Field of the Invention

The present invention relates to a plating apparatus and a plating method for forming a uniform plating layer on a semiconductor substrate.

2. Background Of the Invention

FIG. 7A shows a face-up type plating apparatus of the prior art wherein surface of a wafer 101 is plated while being arranged to face upward, and FIG. 7B is an enlarged view of a sealing portion of the wafer 101. In the drawing, the numeral 1 denotes a wafer processing vessel, 2 denotes a plating solution nozzle, 2a denotes holes of a drain-board, 3 denotes a plating solution supply pipe, 4 denotes a plating solution discharge pipe, 5 denotes a drain pipe, 6 denotes a plating tank, 7 denotes a plating solution, 8 denotes an upper portion of the wafer processing vessel, 9 denotes a lower portion of the wafer processing vessel, 10 denotes a cathode contact, 11 denotes a sealing material, 12 denotes a nitrogen gas injection release, 14 denotes a mesh electrode, 16 denotes an auxiliary sealing material and 101 denotes a wafer.

In the plating apparatus described above, the plating solution 7 supplied through the plating solution supply pipe 3 is discharged through the plating solution discharge pipe 4, and is circulated throughout the period of plating process. A specified voltage is applied across the mesh anode electrode 14 and the wafer 101 via the cathode contact 10, thereby to form a plated coating on the wafer 101 surface. In such a face-up type plating apparatus, because the wafer surface is arranged to face upward, deposition of air bubbles onto the wafer surface can be prevented and plated coating of better quality can be formed in comparison to the face-down plating method where the wafer is arranged to face downward.

FIG. 8 shows a distribution of a plated coating thickness over the surface of a 4" wafer plated with Au in the above plating apparatus with a current density of 5 mA/cm$^2$ for a plating time of 12 minutes, where a distance from the wafer edge is plotted along the axis of abscissa and plate coat thickness is plotted along the axis of ordinate. As is clear from FIG. 8, the plated coating thickness shows a W-shaped distribution which has a peak at the center of the wafer and increases toward the edge.

Through an investigation into the cause of such a distribution of the plated coating thickness, it was found that the distribution of the thickness is greatly affected by the distribution of the transported ions of the plating metal, which is determined by the flow velocity distribution of the plating solution, and the distribution of the electric field on the wafer surface. Specifically, in the plating apparatus described above, because a flow velocity of the plating solution is highest, and accordingly the transported quantity of ions of the plating metal is largest, at the center of the wafer which is located just below the plating solution supply pipe 3, a plated coating is formed with the largest thickness at the center, while the electric field is concentrated at the edge which leads to the plated coating being formed with the second largest thickness along the edge of the wafer.

On the other hand, a method may be used in which as the flow velocity of the plating solution 7 supplied through the plating solution supply pipe 3 is slower, thereby reducing the distribution of the flow velocity of the plating solution on the wafer surface. However, when such a method is used, the plating solution 7 becomes stagnant locally on the wafer surface, resulting in lower quality of the plating.

SUMMARY OF THE INVENTION

Thus, an object of the present invention is to provide a plating apparatus and a method of plating, which improve the uniformity of the plate coat thickness without changing the flow velocity of feeding the plating solution.

The present inventors have intensively studied. As a result, it has been found that unevenness in the plate coat thickness due to the flow velocity distribution of the plating solution can be mitigated and uniform distribution of the plate coat thickness can be achieved over the wafer surface, by providing an aperture at the center of a meshed anode electrode of a plating apparatus thereby to obtain an electric field density distribution, between the meshed anode electrode and the wafer, that is lower in the central portion of the wafer than in the portion along the edge, thus completing the present invention.

That is, the present invention provides an anode electrode installed to oppose a wafer, whereon a plating coat is to be deposited, for generating a specified electric field distribution over the wafer surface, which is a meshed electrode capable of supplying plating solution and has an aperture at the center of the meshed electrode.

Because the meshed anode electrode has the aperture at the center thereof, an electric field density distribution that is lower in the central portion of the wafer than in the portion along the edge can be obtained by using the meshed electrode as the anode to form electric field between the electrode and the wafer.

Thus the flow velocity of the plating solution can be made lower in the central portion of the wafer than in the portion along the edge, making it possible to mitigate the unevenness in the plate coat thickness due to the flow velocity distribution of the plating solution which has been a problem for the prior art, thus improving the uniformity of plate coat thickness over the wafer surface.

The meshed anode electrode may be an electrode made by weaving a thread-like material as shown in FIG. 2A, or an electrode made by punching holes through a sheet as shown in FIG. 2B.

The present invention also provides a plating apparatus which comprises, a plating tank wherein a wafer is placed so that the plating surface faces upward, plating solution supply means for causing the plating solution supplied from above onto the plating surface of the wafer at the center thereof to flow from the center of the plating surface of the wafer toward the periphery, and a meshed anode electrode installed to oppose a wafer for generating an electric field distribution by using the wafer as a cathode, wherein an aperture is made at the center of the meshed anode electrode to obtain an electric field density distribution that is lower in the central portion of the wafer than in the portion along the edge.

Because the plating apparatus of the present invention uses the meshed anode electrode which has the aperture at the center thereof, an electric field density distribution that is lower in the central portion of the wafer than in the portion along the edge can be obtained. As a result, unevenness in the plate coat thickness due to the flow velocity distribution of the plating solution can be mitigated. That is, an increase in the plate coat thickness at the central portion of the wafer due to the flow velocity distribution of the plating solution can be suppressed by decreasing the electric field density in the central portion of the wafer, thereby making it possible to improve the uniformity of the plate coat thickness over the wafer surface.

The meshed anode electrode is a circular electrode having a diameter nearly equal the wafer diameter, and the aperture of the meshed anode electrode is preferably a circular aperture having a diameter of 40 to 80% of the wafer diameter.

This is because it is most preferable for improving the uniformity of the plate coat thickness to use the meshed anode electrode which has the same circular shape as the wafer and also has a circular aperture of diameter 40 to 80% of the wafer diameter.

The present invention also provides at method of plating the surface of a wafer, comprising the steps of causing the plating solution supplied onto the plated surface of the wafer to flow from the center of the plated surface of the wafer toward the periphery, generating an electric field between the wafer and the meshed anode electrode which is arranged to oppose the wafer, and generating such an electric field distribution that mitigates the unevenness in the plate coat thickness caused along the flow of plating solution by using the meshed anode electrode having the aperture at the central portion thereof.

By using such a method, a uniform plating coat can be obtained.

The present invention also provides a wafer for semiconductor devices provided with a plating layer plated by the above method, wherein the distribution of the plating layer thickness on the wafer is about 10%, more specially 5%.

DETAILED DESCRIPTION OF THE PREFERRED EMBODIMENT

Figure 1A:
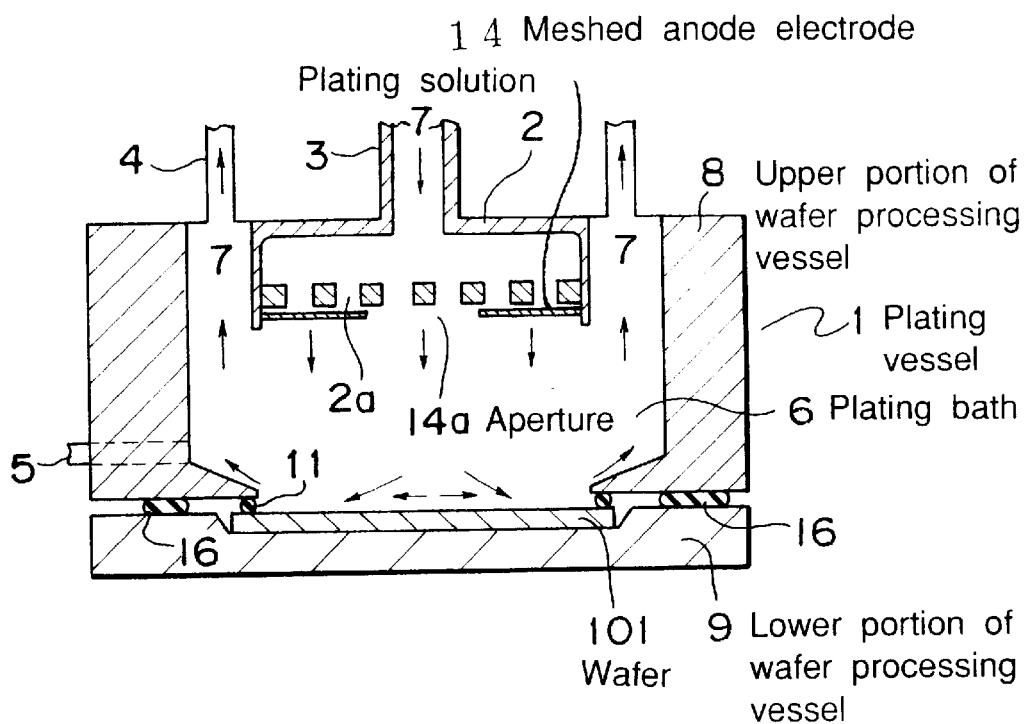
FIG. 1A is a sectional view of the plating apparatus according to the present invention.
Figure 7A:
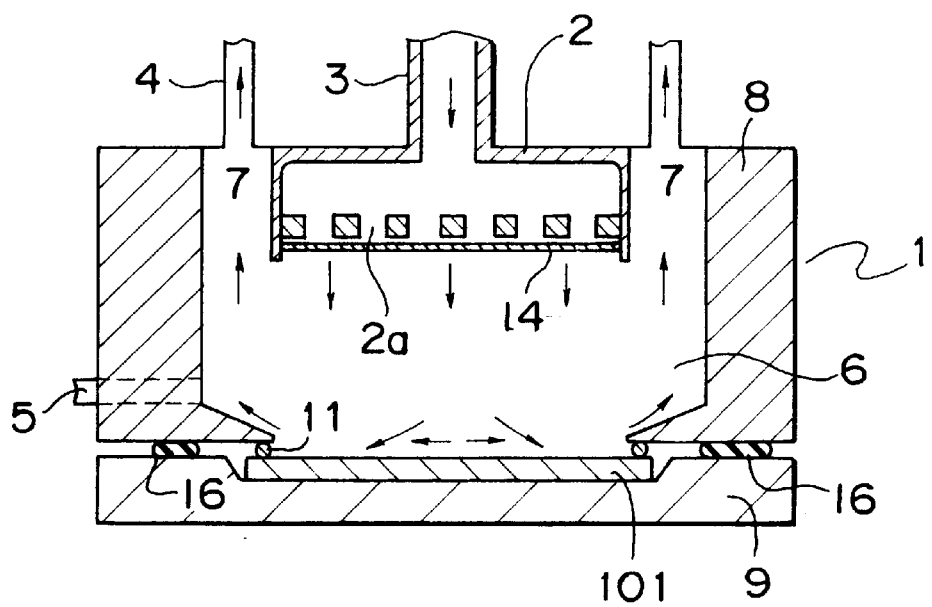
FIG. 7A is a sectional view of the plating apparatus of the prior art.

FIG. 1A shows a plating apparatus according to one embodiment of the present invention, where the numerals which are identical with those of FIG. 7A denote identical or corresponding components.

Figure 7B:
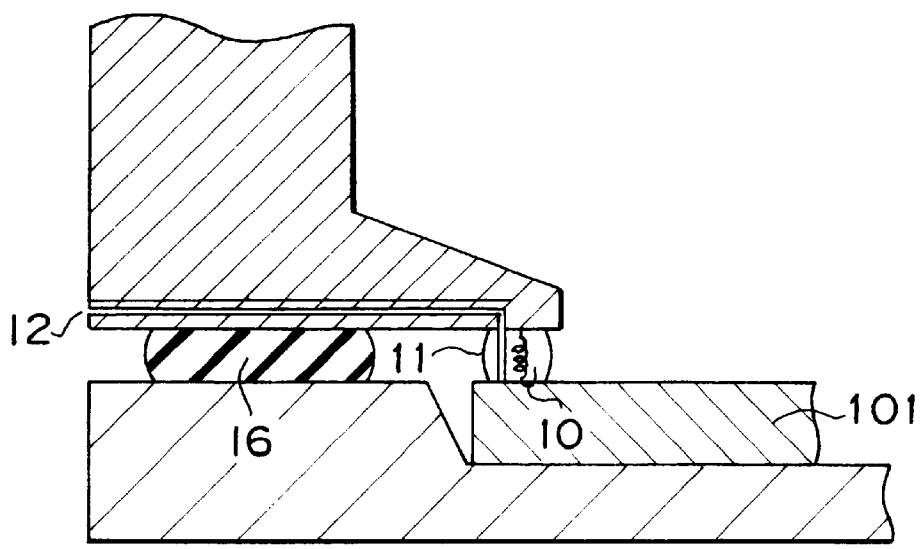
FIG. 7B is a partial sectional view of the plating apparatus of the prior art.

According to the plating method of the present invention, first, an upper portion 8 of a wafer processing vessel and a lower portion 9 of the wafer processing vessel are separated, with a wafer 101 being placed at the lower portion 9 of the wafer processing vessel by robotic transfer equipment, for example, so that the plating surface faces upward, and the lower portion 9 of the wafer processing vessel moves upward or the upper portion 8 of the wafer processing vessel moves downward, in order to bring the wafer 101 and a cathode contact 10 (refer to FIG. 7B) included in a sealing element 11 into contact with each other, and a joint between the upper portion 8 of the wafer processing vessel and the lower portion 9 of the wafer processing vessel is sealed by sealing elements 11 and 16.

Then plating solution 7 is supplied from a plating solution supply pipe 3 which is installed above the center of the wafer 101 to fill the wafer processing vessel 1, while the plating solution 7 flows through the holes of a drain-board 2*a* and the mesh anode electrode 14 onto the wafer 101 and flows from the center toward the periphery of the wafer 101, eventually to be discharged from a plating solution discharge pipe 4 located above the periphery and circulated.

As the plating solution 7, an Au plating solution including sodium gold sulfite or potassium gold cyanide as a major component is commonly used, while the temperature of the plating solution is usually set to about 50 to 70° C.

While such a plating solution 7 is circulated, the flow velocity of the plating solution 7 over the wafer surface becomes maximum at the center of the wafer 101 and decreases toward the periphery, in a concentric distribution. Therefore, ions of the plating metal which are transported are concentrated in the central portion of the wafer 101 and, when the plating apparatus of the prior art shown in FIG. 7A is used, the plated coating becomes thicker in the central portion of the wafer.

Figure 2A:
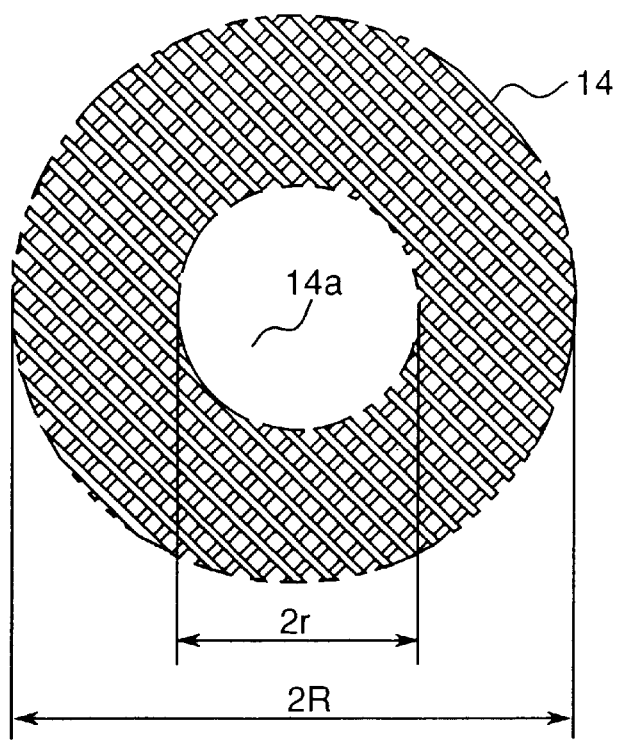
FIGS. 2A and 2B are plan views of a mesh anode electrode according to the present invention.

According to the present invention, on the other hand, a circular aperture 14*a* as shown in FIG. 2A, for example, is present at the center of the mesh anode electrode 14 an electric field between the mesh anode electrode 14 and the wafer 101 in which the electric field density is lower in the central portion of the wafer 101 (that is, electric lines of force are sparsely distributed), while leaving the flow velocity of the plating solution as it is.

Figure 2B:
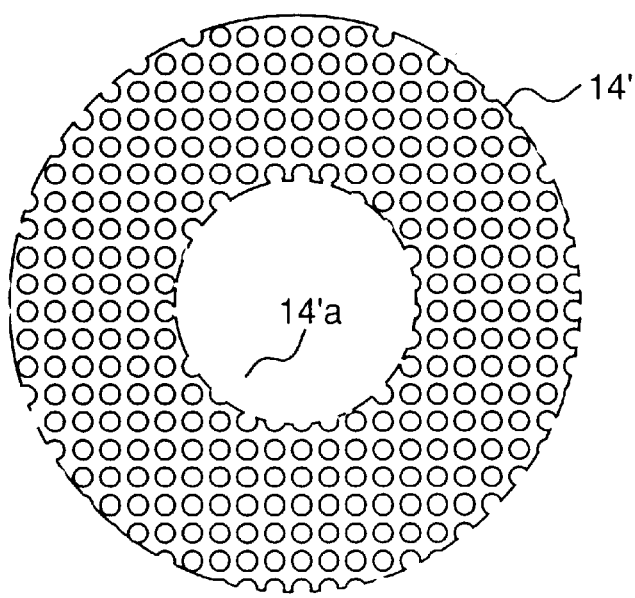

FIG. 2A shows, an annular mesh anode electrode having an aperture 14*a* at the center of a woven mesh of a Ti/Pt-plated sheet, which may be replaced by the annular anode electrode 14' of FIG. 2B comprising a Pt/Ta/Pt-clad plate having a plurality of punched holes and an aperture 14'*a* at the center of the electrode. The outer diameter of the mesh anode electrode is preferably about the same as the diameter of the wafer to be plated and, in this embodiment, the diameter of the mesh anode electrode is preferably about 120 mm because a 4-inch wafer is assumed to be the object of the plating treatment.

The electric field distribution over the wafer may be controlled by a method, for example, disclosed in Japanese Utility Model Kokai No. 6-37354 wherein a baffle plate is installed between the mesh anode electrode 14 and the wafer 101. Such a method changes the direction of flow of the plating solution, which deteriorates in the uniformity of thickness distribution of the plating coat.

Thus the electric field between the mesh anode electrode 14 and the wafer 101 has lower electric field density in the central portion of the wafer, so that the plating reaction in the central portion of the wafer 101 is suppressed, and the plated coating is thinner in the central portion of the wafer 101.

As a result, such an electric field density distribution mitigates the unevenness in the plated coating thickness due to the flow velocity distribution of the plating solution. Namely the increase in the plated coating thickness in the central portion of the wafer due to the flow velocity distribution of the plating solution can be suppressed by decreasing the electric field, density in such a portion, making it possible to improve the uniformity of the plated coating thickness on the wafer surface.

Figure 3:
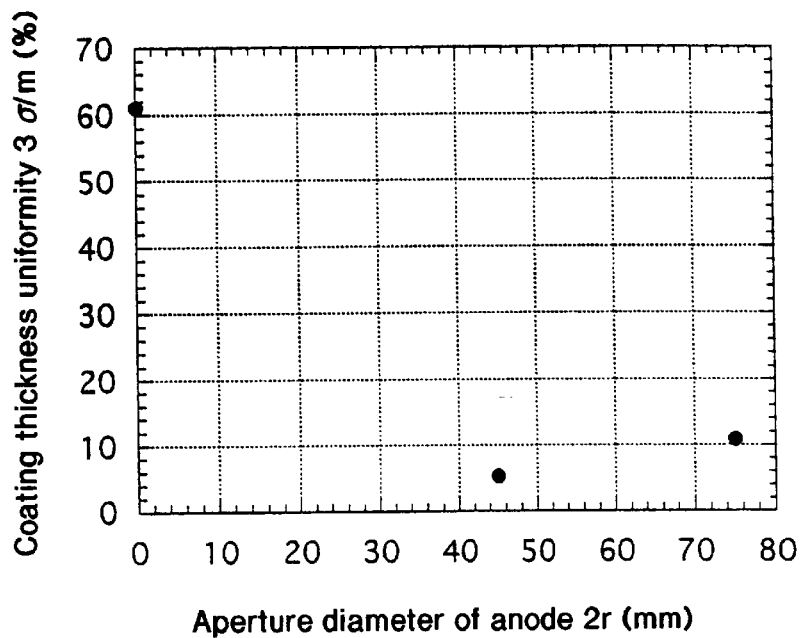
FIG. 3 shows a relation between the diameter of aperture in the mesh anode electrode and the plated coating thickness uniformity when the plating apparatus of the present invention is used.

FIG. 3 shows a relation between the aperture diameter (the diameter of the hole in the anode) and the measured value of the thickness uniformity (3 σ/m:m mean thickness at 21 points) when the aperture 14a of the mesh anode electrode 14' 123 mm in diameters is changed.

From FIG. 3, it can be seen that, while the coating thickness uniformity is 60% when the diameter of the anode hole is zero, namely in the case of the conventional configuration where the aperture is not provided, the coating thickness is non-uniformity reduced to 10% or lower by providing an aperture and, when the aperture diameter is 45 mm, in particular, an extremely good uniformity of the coating thickness of about 5% can be obtained.

The results shown in FIG. 3 and others show that the aperture of the mesh anode electrode is preferably formed in the central portion of the electrode with a diameter in a range of about 40 to 80% of the mesh anode electrode outside diameter which is made nearly equal to the wafer diameter.

Figure 4:
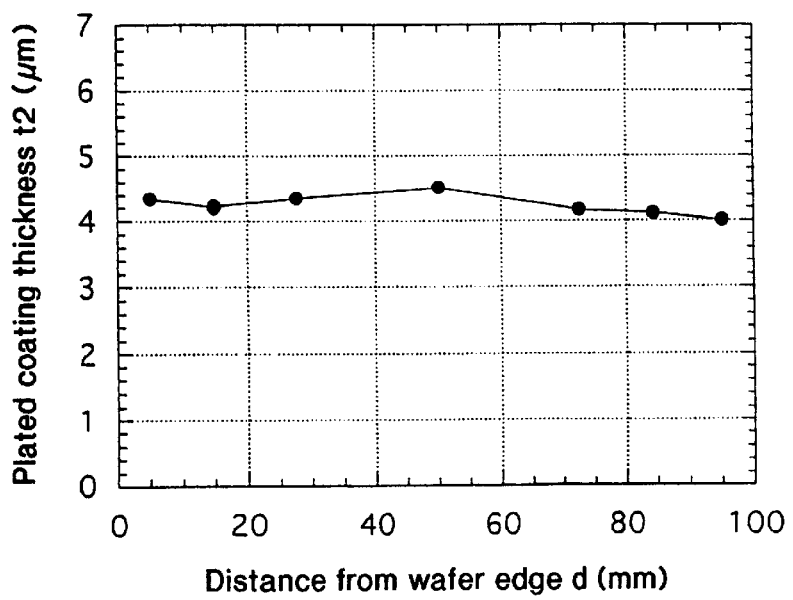
FIG. 4 shows a thickness distribution of the plated coating formed by using the plating apparatus of the present invention.

FIG. 4 shows a distribution of a plated coating thickness over the surface of a 4" wafer which is plated using the mesh anode electrode 14 with the diameter of the anode aperture at 75% of the anode diameter. The distance from the wafer edge is plotted along the abscissa and plated coating thickness is plotted along the ordinate. Plating conditions are the same as those of the case shown in FIG. 8: the current density is 5 mA/cm$^2$ and plating time is 12 minutes.

Figure 8:
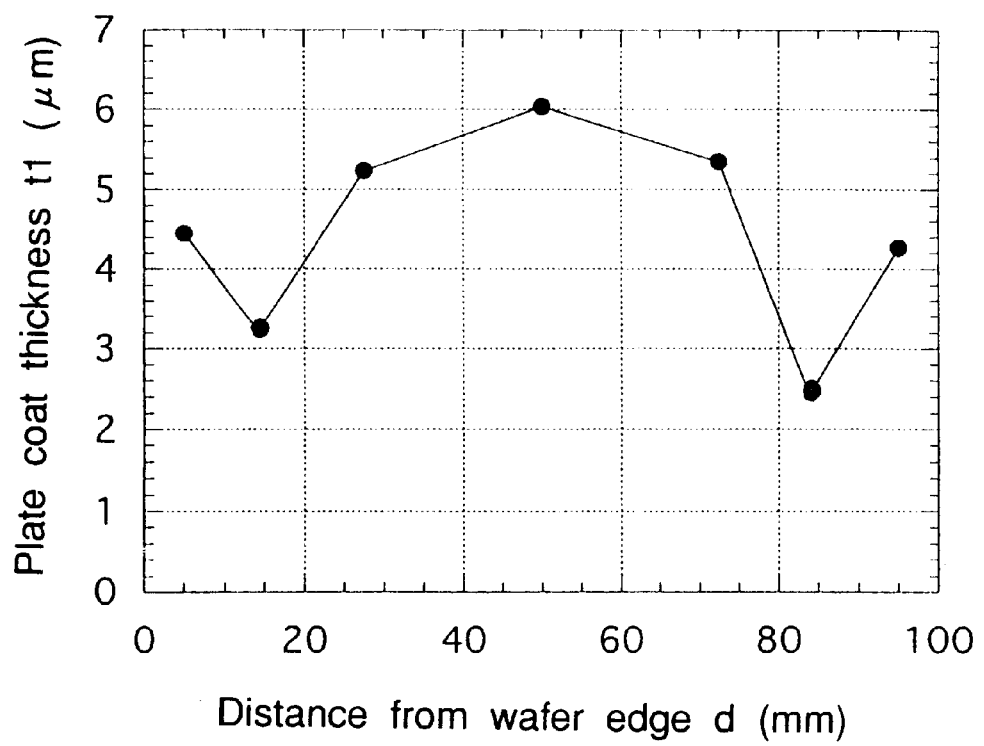
FIG. 8 shows a thickness distribution of the plating coat formed by using the plating apparatus of the prior art.

By comparing the distribution of the plated coating thickness obtained by using the meshed anode electrode 14 according to the present invention and the distribution of the plated coating thickness obtained by using the conventional mesh anode electrode shown in FIG. 8, it is clearly seen that the coating thickness at the center is reduced to about 4.5 μm which is near the mean plating thickness in the case of FIG. 4, in contrast to 6 μm in the case of FIG. 8, and the decrease in coating thickness at a position 15 mm inward from the edge of wafer observed in FIG. 8 is eliminated in the case of FIG. 4.

This result is presumably because electric field density is lower (electric lines of force are sparsely distributed) in the vicinity of the center of the wafer which the mesh anode electrode of the present invention is used, so the plating reaction is suppressed in the central portion of the wafer compared to the prior art. Also, because the plating reaction is suppressed in the central portion, ions of the plating metal which would be consumed in the plating reaction in the central portion in the prior art are carried by the flow of plating solution and supplied along the periphery of the wafer, and therefore the decrease, in the coating thickness in a portion about 15 mm inward from the edge of wafer, which is observed in FIG. 8, is presumably suppressed by the supply of ions of the plating metal.

FIG. 5 shows a method of producing semiconductor devices which uses the plating apparatus provided with the mesh anode electrode described above.

Figure 5A:
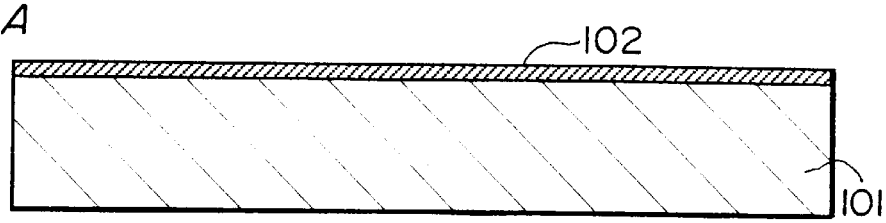
FIGS. 5A–5D are sectional views of steps in the process for producing semiconductor devices using the plating apparatus of the present invention.

First, a plating feeding seed layer (a laminated layers of Ti/Au, TiW/Au, Cr/Au, etc., for example) 102 is formed on the semiconductor wafer 101 made of Si, GaAs or the like, as shown in FIG. 5A, by vapor deposition or sputtering.

Figure 5B:
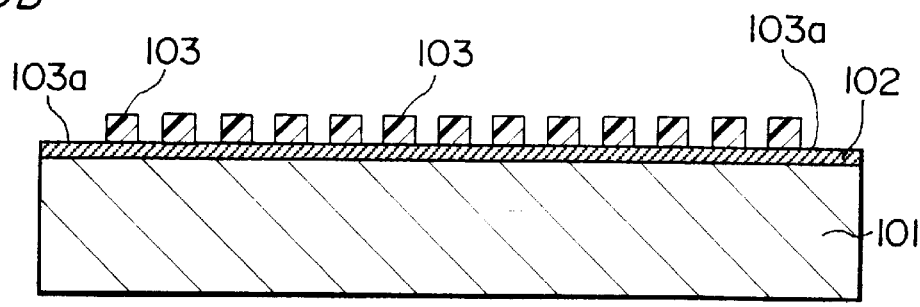
Figure 5C:
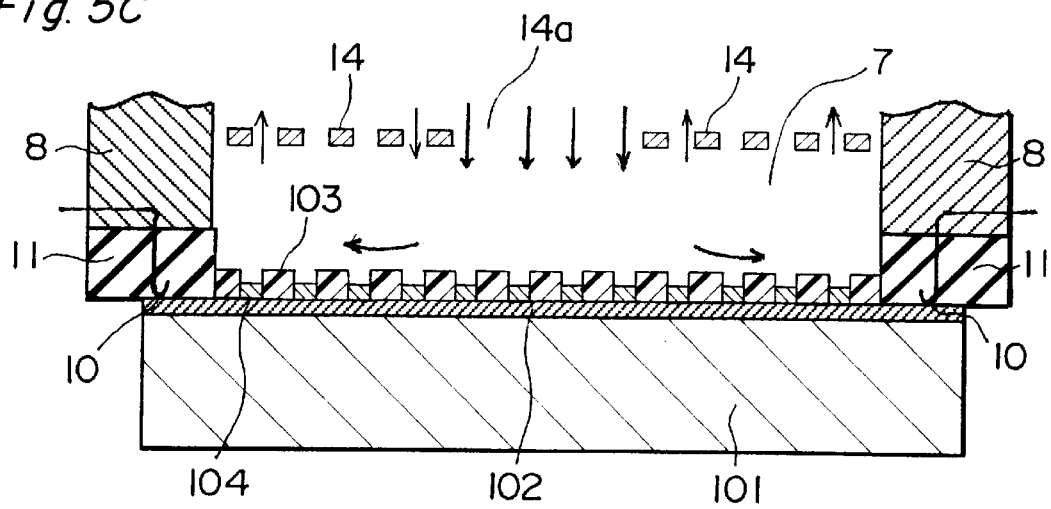

Then a photoresist pattern 103 is formed by image transfer on the semiconductor wafer 101 whereon the plating feeding layer 102 has been formed as shown in FIG. 5B. At this time, a contact pattern 103a where the photoresist pattern 103 is not formed is left at one or more places along the edge of the wafer 101.

Figure 1B:
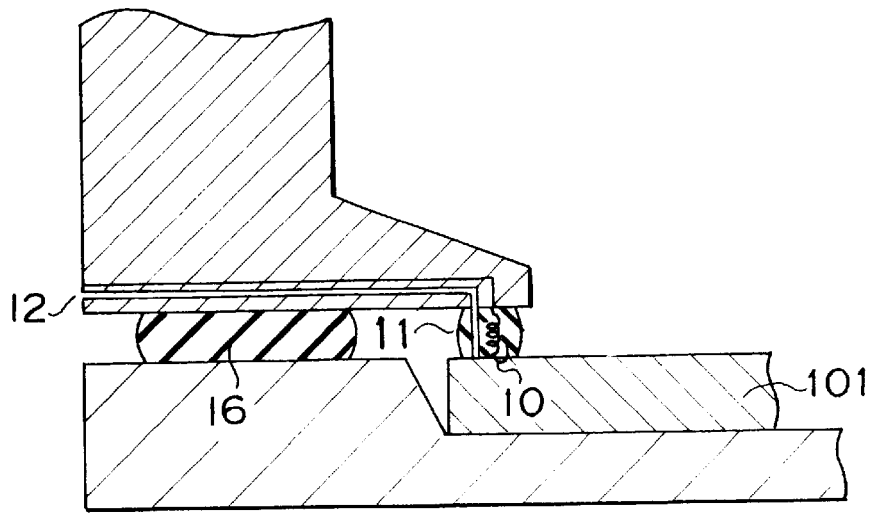
FIG. 1B is a partial sectional view of the plating apparatus according to the present invention.

Then the wafer 101 is placed on the lower portion 9 of the wafer processing vessel of the plating apparatus (refer to FIG. 1A) of the present invention, while placing the upper portion 8 of the wafer processing vessel having a sealing element 11, such as an O-ring, over the wafer 101 and sealing around the wafer with the sealing element 11. At this time, the cathode contact 10 incorporated in the sealing element 11 and the contact pattern 103a provided around the semiconductor wafer 101 are electrically connected to each other (refer to FIG. 1B).

Now, the plating solution 7 is introduced into the wafer processing vessel 1 through the plating solution supply pipe 3. The plating solution 7 is supplied from the plating solution supply pipe 3 located above the center of the wafer 101 through holes 2a of the drain board and the mesh anode electrode 14 onto the wafer 101, then flows over the surface of the wafer 101 from the central portion thereof toward the periphery, and is discharged from the discharge pipe 4 installed above the wafer edge to the outside of the wafer processing vessel 1, thereby to circulate the solution.

Then an electric field with a current density of several milli-Amperes/cm$^2$ to several tens of milli-Amperes/cm$^2$ is applied across the mesh anode electrode 14 and the cathode, namely the feeding layer 102 on the wafer 101, in constant-current electrolysis, for example, thereby to carry out plating on the surface of the wafer 101, using the photoresist pattern 103 provided on the wafer 101 as the mask.

In the plating apparatus (FIG. 1A) described above, because the electrode having a, hole at the center as shown in FIGS. 2A and 2B is used as the mesh anode electrode 14, electric field density is lower in the central portion of the wafer 101 than in the periphery. Thus, it is made possible to form the plated coating 104 having a more uniform thickness than that obtained by using a conventional plating apparatus.

Figure 5D:
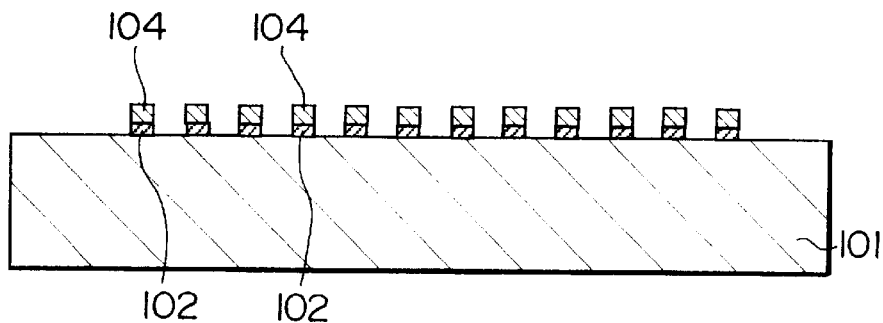

Last, the wafer 101 is taken out of the wafer processing vessel as shown in FIG. 5D and, after the resist pattern 103 is removed by means of an organic solvent treatment, oxygen ashing or the like, the plating feeding layer 102 is removed, from portions where the plating coat 104 is not formed, by RIE or an ion milling process, thereby to obtain the desired plating pattern.

The above producing method can be applied to the formation of Au bumps on a Si wafer, GaAs wafer or the like, Au plating of wiring and plating of an electrode.

Figure 6:
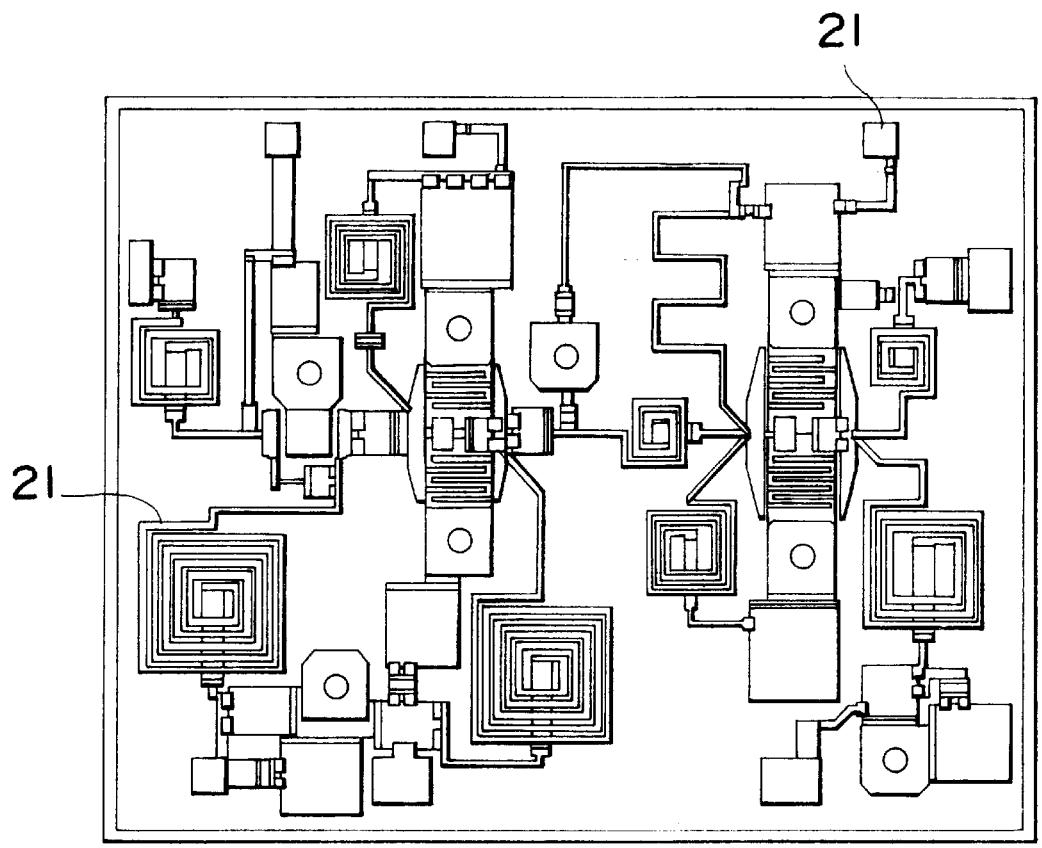
FIG. 6 is a plan view of the semiconductor device provided with the plating layer plated by the method of the present invention.

FIG. 6 shows the plan view of the semiconductor device with the plated layer plated by the method of the present invention. In the drawing, 21 denotes a plated layer.

Generally, a plurality of the semiconductor devices can be made one wafer. Using the method of the present invention, a good plated layer uniformity (the distribution of the plated layer thickness ) of about 10%, more specially 5%, in the wafer can be obtained. Therefore good plated layer uniformity between the semiconductor devices on the wafer can be obtained.

What is claimed is:

1. A method of plating a surface of a wafer, comprising:

supplying a plating solution downward onto a plating surface of a wafer facing upward so the solution flows from a center of the plating surface of the wafer toward a periphery of the plating surface of the wafer; and generating an electric field between the wafer and an anode electrode having a central aperture and a plurality of openings surrounding the central aperture, the anode being located opposite the wafer, wherein the plating surface of the wafer and the central aperture of the anode are circular and have respective diameters and the diameter of the central aperture is in a range of 40 to 80% of the diameter of the plating surface.

2. The method according to claim 1, wherein the anode electrode comprises a mesh through which the plating solution can be supplied.

3. The method according to claim 1, wherein the anode electrode comprises a board containing the plurality of holes through which the plating solution can be supplied.

* * * * *